(12) United States Patent
Wei

(10) Patent No.: US 12,332,776 B2
(45) Date of Patent: Jun. 17, 2025

(54) MEMORY SUB-SYSTEM LUN BYPASSING

(71) Applicant: Micron Technology, Inc., Boise, ID (US)

(72) Inventor: Meng Wei, Pudong New District (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/036,781

(22) PCT Filed: Sep. 1, 2022

(86) PCT No.: PCT/CN2022/116454
§ 371 (c)(1),
(2) Date: May 12, 2023

(87) PCT Pub. No.: WO2024/045113
PCT Pub. Date: Mar. 7, 2024

(65) Prior Publication Data
US 2024/0345946 A1 Oct. 17, 2024

(51) Int. Cl.
G06F 12/02 (2006.01)
G06F 3/06 (2006.01)

(52) U.S. Cl.
CPC ........ G06F 12/0246 (2013.01); G06F 3/0616 (2013.01); G06F 3/0644 (2013.01); G06F 3/0688 (2013.01); G06F 2212/7201 (2013.01)

(58) Field of Classification Search
CPC .... G06F 3/0616; G06F 3/0644; G06F 3/0688; G06F 12/0246; G06F 2212/7201
See application file for complete search history.

(56) References Cited

U.S. PATENT DOCUMENTS

| 6,249,838 | B1 * | 6/2001 | Kon | G11C 16/349 711/E12.008 |
| 9,164,836 | B2 | 10/2015 | Guo et al. | |
| 2004/0054775 | A1 * | 3/2004 | Poliac | G16H 40/67 709/224 |
| 2016/0110126 | A1 * | 4/2016 | Lee | G11C 11/5628 711/103 |
| 2019/0189167 | A1 * | 6/2019 | Suhler | G11C 7/1096 |
| 2020/0174693 | A1 * | 6/2020 | Boals | G06F 3/0679 |

FOREIGN PATENT DOCUMENTS

CN 104011800 8/2014

* cited by examiner

Primary Examiner — Larry T Mackall
(74) Attorney, Agent, or Firm — Brooks, Cameron & Huebsch, PLLC

(57) ABSTRACT

A method includes assigning a respective initial credit value to each LUN of a block stripe; performing an erase operation across the block stripe; reducing, in response to the erase operation, each respective initial credit value by a unit increment to provide a respective reduced credit value; refraining from programming to each LUN of the block stripe having a respective reduced credit value equal to zero; and programming to each LUN of the block stripe having a respective reduced credit value greater than zero.

17 Claims, 8 Drawing Sheets

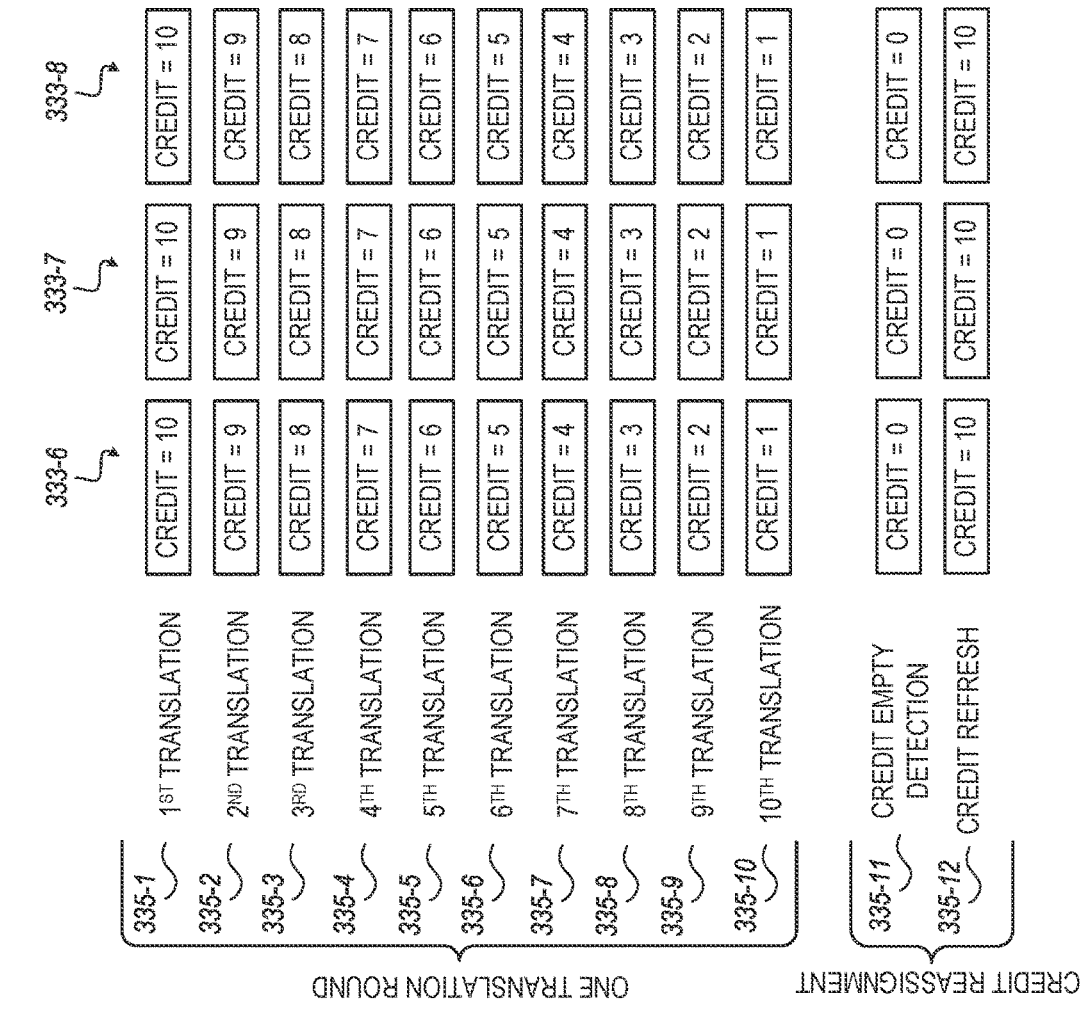

MEMORY SUB-SYSTEM LUN BYPASSING

PRIORITY INFORMATION

This application is a Nation Stage Application under 35 U.S.C § of International Application Number PCT/CN2022/116454, filed on Sep. 1, 2022, the contents of which are incorporated herein by reference.

TECHNICAL FIELD

Embodiments of the disclosure relate generally to memory sub-systems, and more specifically, relate to memory sub-system LUN bypassing.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 3A-1, 3A-2 is a block diagram of a number of LUNs having a respective initial credit value.

FIGS. 3B-1, 3B-2 is a block diagram of a number of LUNs having a respective initial credit value.

DETAILED DESCRIPTION

Figure 1:
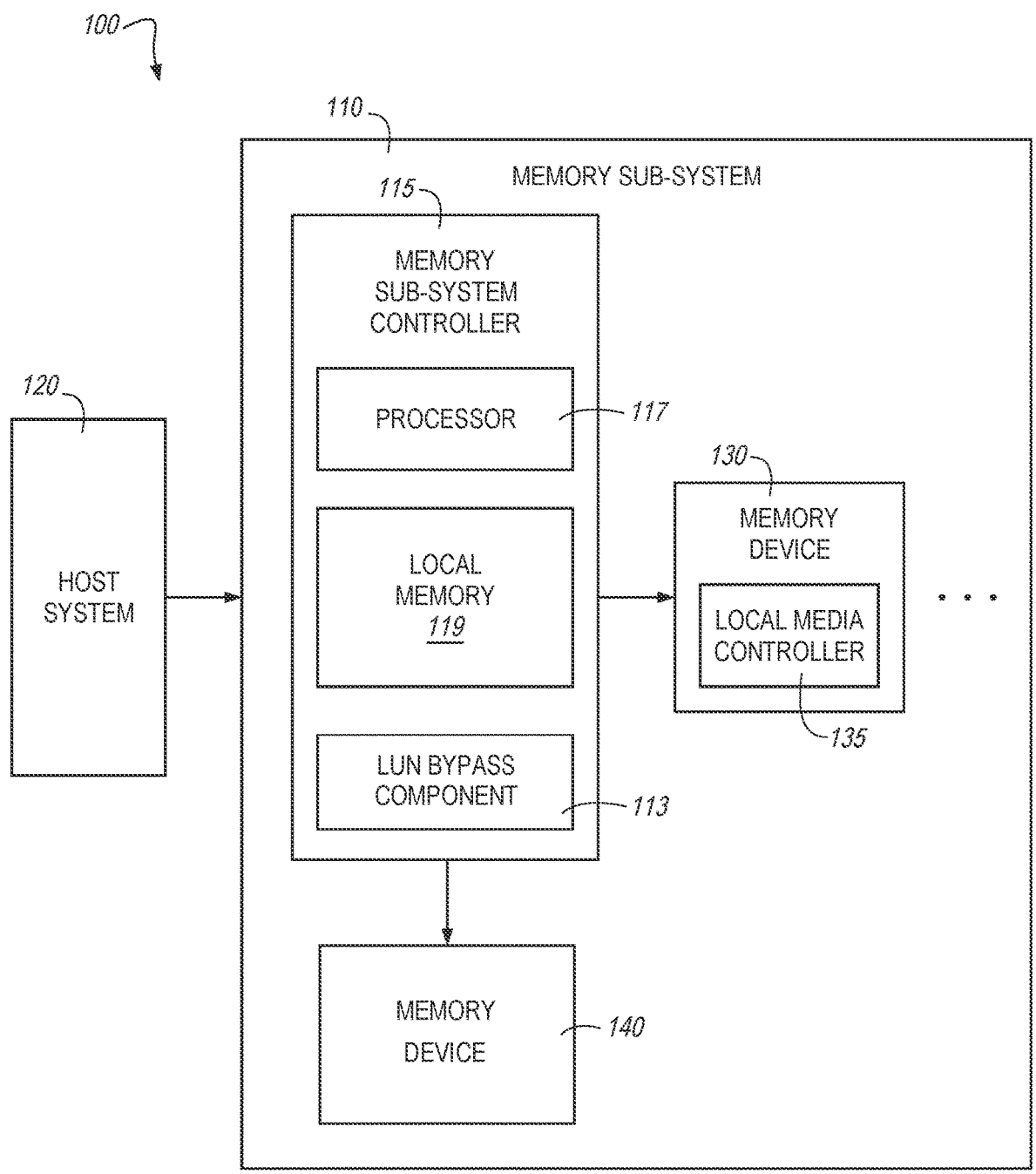
FIG. 1 illustrates an example computing system that includes a memory sub-system in accordance with some embodiments of the present disclosure.

Aspects of the present disclosure are directed to memory sub-system LUN bypassing, in particular to memory sub-systems that include a memory sub-system LUN bypass component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a three-dimensional cross-point memory device that includes a cross-point array of non-volatile memory cells. Other examples of non-volatile memory devices are described below in conjunction with FIG. 1. A non-volatile memory device, such as a three-dimensional cross-point memory device, can be a package of one or more memory components (e.g., memory dice). Each die can consist of one or more planes. Planes can be grouped into logic units. For example, a non-volatile memory device can be assembled from multiple memory dice, which can each form a constituent portion of the memory device.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Due to fabrication inconsistences, different logic units (LUN) can have different Program Erase Count (PEC) endurances. For a number of applications, particular PEC endurances may be specified. For instance, for a number of applications, a 10,000 PEC (or greater) may be specified. For these applications utilizing particular PEC endurances (e.g., ≥10,000 PEC), previous approaches have categorized LUNs having a PEC less than the specified PEC endurance (e.g., <10,000 PEC) as failures and not utilized those LUNs having a PEC less than the specified PEC endurance for these applications. For example, those LUNs having a PEC less than the specified PEC endurance have been registered as a yield loss.

Aspects of the present disclosure address the above and other deficiencies. Embodiments of the present disclosure provide that LUNs having a PEC less than a specified PEC endurance for particular applications may be utilized, in contrast to being categorized as failures. As such, embodiments of the present disclosure provide that fewer LUNs are registered as a yield loss, thus providing an improved yield loss, as compared to previous approaches.

The PEC endurance for a LUN may be determined by various processes. For instance, the PEC endurance for a LUN may be determined by operating (e.g., at a manufacturing facility) the LUN within particular predefined criteria (e.g., operations including read operations, erase operations, and program operations).

One or more embodiments provide that a PEC endurance can be determined and/or rounded to a nearest thousand value. For instance, the PEC endurance may have a value of 10,000, 9,000, 8,000, 7,000, or 6,000 among other values.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a LUN bypass component 113. Although not shown in FIG. 1 so as to not obfuscate the drawings, the LUN bypass component 113 can include various circuitry to facilitate bypassing one or more LUNs for a programming operation. In some embodiments, the LUN bypass component 113 can include special purpose circuitry in the form of an ASIC, FPGA, state machine, and/or other logic circuitry that can allow the LUN bypass component 113 to orchestrate and/or perform operations to selectively perform bypass operations for the memory device 130 and/or the memory device 140 based on a credit value and/or an iterational bitmask value, as discussed further herein.

In some embodiments, the memory sub-system controller 115 includes at least a portion of the LUN bypass component 113. For example, the memory sub-system controller 115 can include a processor 117 (processing device) configured to execute instructions stored in local memory 119 for performing the operations described herein. In some embodiments, the LUN bypass component 113 is part of the host system 110, an application, or an operating system.

In a non-limiting example, an apparatus (e.g., the computing system 100) can include a memory sub-system LUN bypass component 113. The memory sub-system LUN bypass component 113 can be resident on the memory sub-system 110. As used herein, the term "resident on" refers to something that is physically located on a particular component. For example, the memory sub-system LUN bypass component 113 being "resident on" the memory sub-system 110 refers to a condition in which the hardware circuitry that comprises the memory sub-system LUN bypass component 113 is physically located on the memory sub-system 110. The term "resident on" can be used interchangeably with other terms such as "deployed on" or "located on," herein.

The memory sub-system LUN bypass component 113 can be configured to assign a respective initial credit value to each LUN of a block stripe. As described above, the memory components can be memory dice or memory packages that form at least a portion of the memory device 130.

The memory sub-system LUN bypass component 113 that can be further configured to assign a respective iterational bitmask zero value to each LUN with the respective initial credit value being less than a threshold credit bitmask value; perform an erase operation across the block stripe; reduce, in response to the erase operation, each respective initial credit value by a unit increment to provide a respective reduced credit value, wherein each LUN having respective iterational bitmask zero value does not have the respective initial credit value reduced. In some embodiments, the memory sub-system LUN bypass component 113 can provide refrain from programming to each LUN having a respective iterational bitmask zero value; refrain from programming to each LUN having a respective reduced credit value equal to zero; and program to each LUN having a respective reduced credit value greater than zero and to each LUN having a respective iterational bitmask non-zero value.

In another non-limiting example, a system (e.g., the computing system 100) can include a memory sub-system 110 comprising memory components arranged to form a stackable cross-gridded array of memory cells. A processing device (e.g., the processor 117 and/or the local media controller 135) can be coupled to the memory components and can perform operations comprising assigning a respective initial credit value to each LUN of a block stripe; performing an erase operation across the block stripe; reducing, in response to the erase operation, each respective initial credit value by a unit increment to provide a respective reduced credit value; refraining from programming to each LUN having a respective reduced credit value equal to zero, and programming to each LUN having a respective reduced credit value greater than zero.

Figure 2:
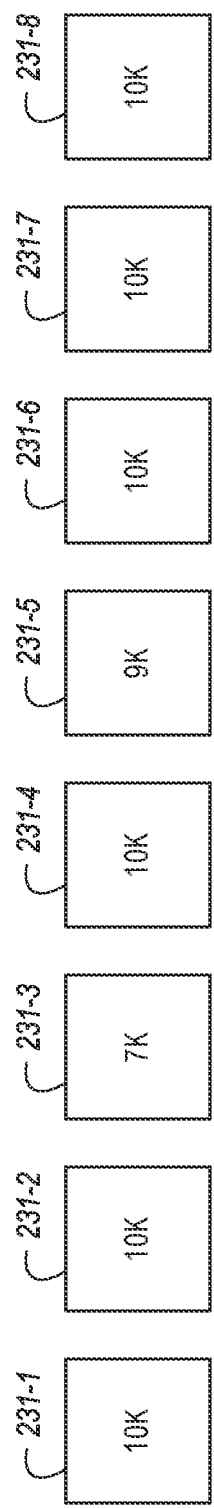
FIG. 2 is a block diagram of a number of LUNs having a respective Program Erase Count endurance.

FIG. 2 is a block diagram of a number of LUNs having a respective PEC endurance. In the example shown in FIG. 2, LUN 231-1 has a 10,000 (10K) PEC endurance, LUN 231-2 has a 10K PEC endurance, LUN 231-3 has a 7K PEC endurance, LUN 231-4 has a 10K PEC endurance, LUN 231-5 has a 9K PEC endurance, LUN 231-6 has a 10K PEC endurance, LUN 231-7 has a 10K PEC endurance, and LUN 231-8 has a 10K PEC endurance. As mentioned, for a number of applications, particular PEC endurances (e.g., ≥10K) may be specified. As such, previous approaches would have categorized LUN 231-3 and LUN 231-5 (each having a respective PEC less than the specified PEC endurance) as failures and not utilized those LUNs. However, embodiments of the present disclosure provide that LUN 231-3 and LUN 231-5 are utilized, as discussed further herein.

Figures 1, 3A:
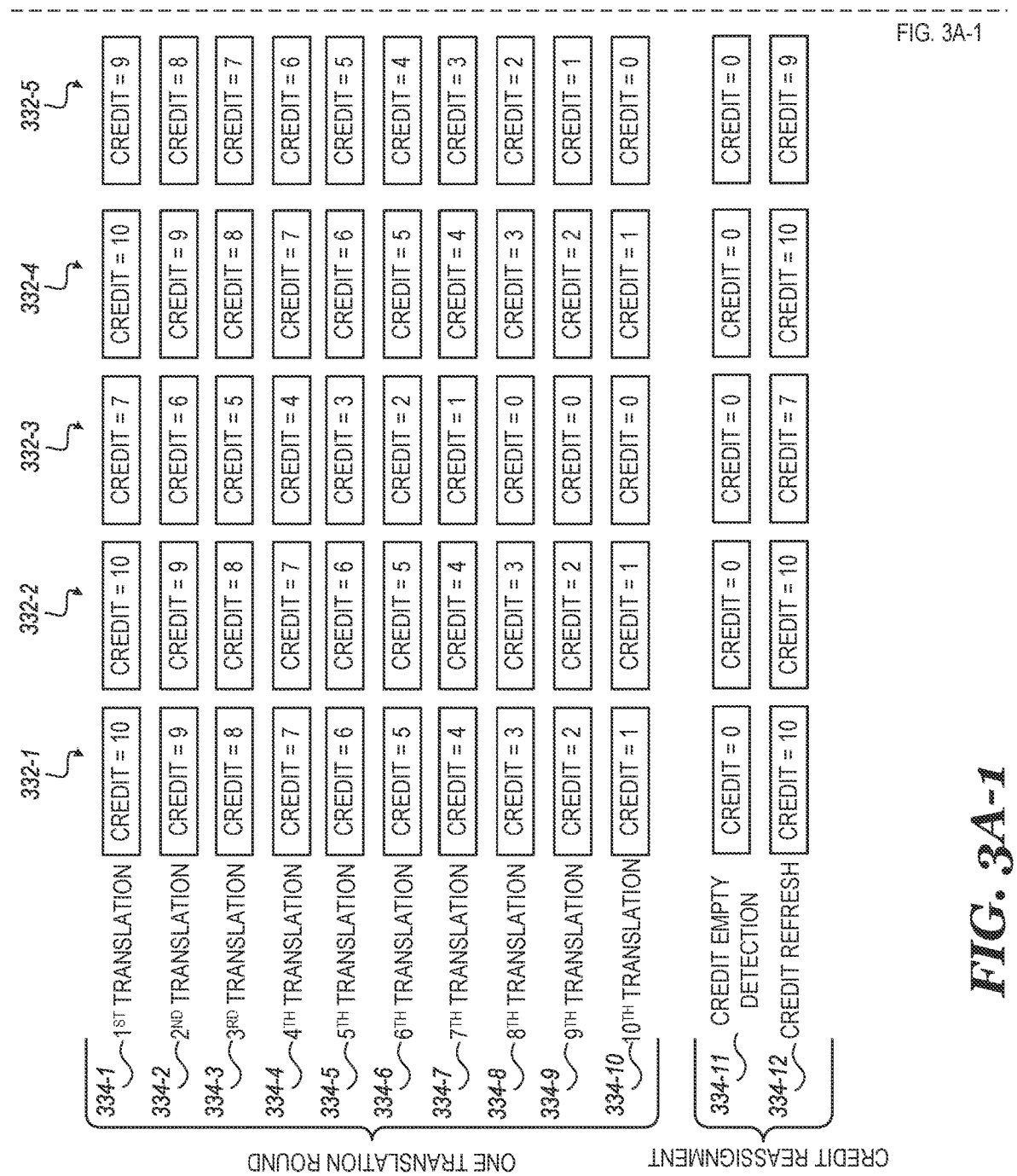
Figures 2, 3A:
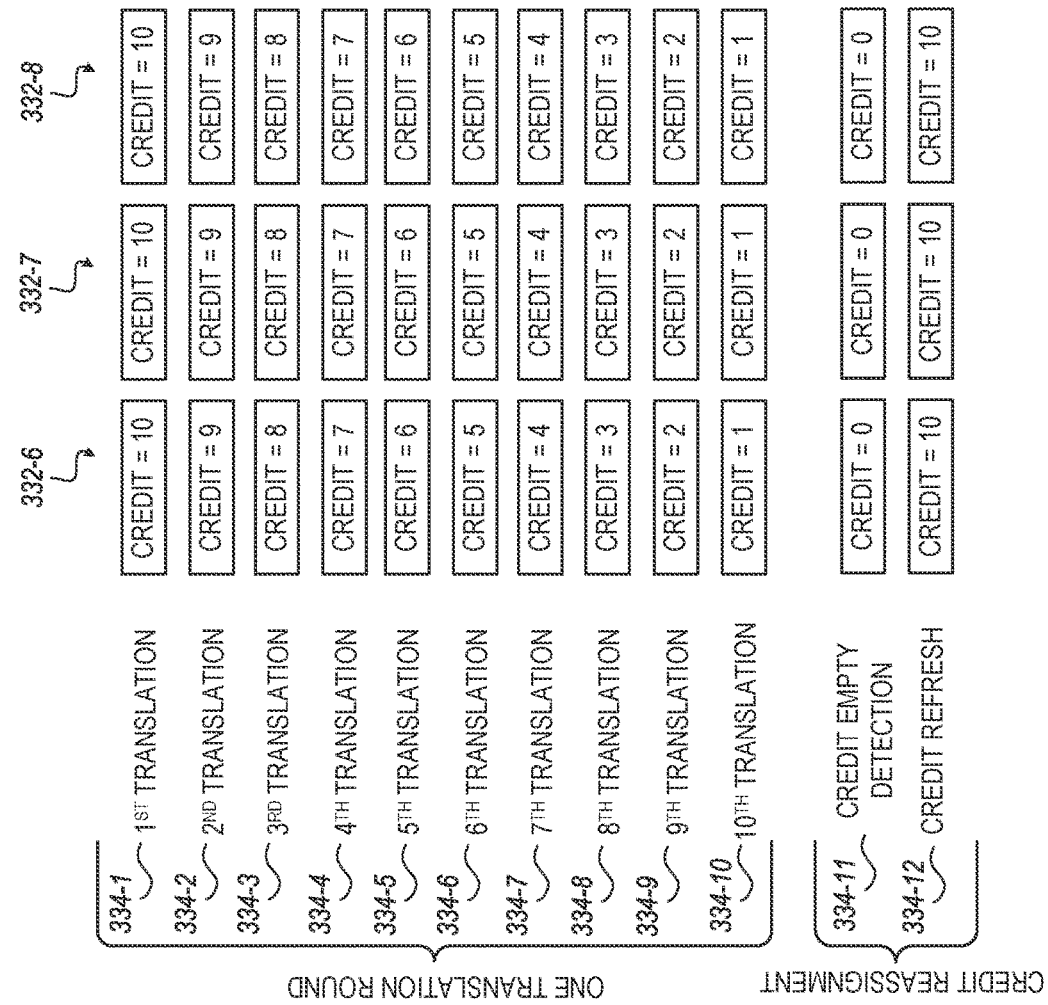

FIGS. 3A-1, 3A-2 is a block diagram of a number of LUNs having a respective initial credit value. One or more embodiments provide that an initial credit value can be a LUN's PEC endurance divided by 1,000. For instance, as shown in FIGS. 3A-1, 3A-2, column 332-1 corresponds to LUN 231-1 having an initial credit value of 10; column 332-2 corresponds to LUN 231-2 having an initial credit value of 10; column 332-3 corresponds to LUN 231-3 having an initial credit value of 7; column 332-4 corresponds to LUN 231-4 having an initial credit value of 10; column 332-5 corresponds to LUN 231-5 having an initial credit value of 9; column 332-6 corresponds to LUN 231-6 having an initial credit value of 10; column 332-7 corresponds to LUN 231-7 having an initial credit value of 10; and column 332-8 corresponds to LUN 231-8 having an initial credit value of 10.

As shown in FIGS. 3A-1, 3A-2, a number of translations (e.g., Flash Translation Layer (FLT) operations including an erase operation) can be performed on each of the LUNs having a respective initial credit value. Each translation may include a program operation and an erase operation. Each translation may be considered an iteration. An iteration may include a programming operation and an erase operation, for instance. One or more embodiments provide that after a performing an erase operation across the block stripe, each respective initial credit value can be reduced by a unit increment (e.g., one) to provide a respective reduced credit value. For instance, as shown in row 334-1, for LUNs having the respective initial credit values, a translation (e.g., an erase operation) can be performed on each of the LUNs having a respective initial credit values to provide a respective reduced credit value (e.g., the respective credit values shown in row 334-2). Specifically referring to FIGS. 3A-1, 3A-2, column 332-1 corresponding to LUN 231-1 having an initial credit value of 10 as shown in row 334-1 can be reduced to the credit value shown row 334-2 (the reduced credit value of 9) following the translation (e.g., an erase operation) performed on LUN 231-1. Similarly, referring to FIGS. 3A-1, 3A-2, column 332-3 corresponding to LUN 231-3 having an initial credit value of 7 as shown in row 334-1 can be reduced to the credit value shown row 334-2 (the reduced credit value of 6) following the translation (e.g., an erase operation) performed on LUN 233-3. Translations (e.g., erase operations) can be repeatedly performed on the LUNs, as shown going from row 334-2 to 334-3, or going from row 334-5 to 334-6, where each respective credit value is reduced by a unit increment (e.g., one) and so forth.

As shown in FIGS. 3A-1, 3A-2, for column 332-3 at row 334-8 the respective credit value is 0 (zero). For a LUN having a credit value that is 0, such as LUN 231-3, corresponding to column 332-3 at row 334-8, that LUN having that credit value that is 0 is bypassed for a current translation round (e.g., as shown going from row 334-8 to 334-9). LUNs having a respective credit value that are 0 are refrained from being programmed to for a current translation round. In other words, LUNs having a respective credit value that are 0 are not active for block stripe (e.g., a block stripe comprising LUN 231-1 (corresponding to column 332-1); LUN 231-2 (corresponding to column 332-2); LUN 231-3 (corresponding to column 332-3); LUN 231-4 (corresponding to column 332-4); LUN 231-5 (corresponding to column 332-5); LUN 231-6 (corresponding to column 332-6); LUN 231-7 (corresponding to column 332-7); and LUN 231-8 (corresponding to column 332-8).

LUNs having a respective credit value that are 0 are not active for a block stripe and do not have their respective credit value reduced (e.g., it remains 0) for a current translation for which the LUN is bypassed. For example, for LUN 231-3 (corresponding to column 332-3), for current translations for which LUN 231-3 is bypassed, as shown going from row 334-8 to 334-9, or going from row 334-9 to 334-10, the respective credit value remains 0.

As shown in row 334-11, each LUN's respective reduced credit value is (e.g., has been reduced to) equal to 0. When it determined that each LUN's (e.g., each LUN of an associated block stripe) respective reduced credit value is equal to 0, then each of the LUN's respective initial credit values can be reassigned to the respective LUNs. For example, LUN 231-1 having an initial credit value of 10 as shown in row 334-1 can be reduced by a unit value through a number of translations (e.g., erase operations) to the reduced credit value is equal to 0 shown in row 334-11 and thereafter be reassigned the initial credit value of 10 as shown in row 334-12. Similarly, LUN 231-3 having an initial credit value of 7 as shown in row 334-1 can be reduced by a unit value through a number of translations (e.g., erase operations) to the reduced credit value is equal to 0 shown in rows 334-8 through 334-11 and thereafter be reassigned the initial credit value of 7 as shown in row 334-12. After each of the LUN's respective initial credit values are reassigned to the respective LUNs, the translations, credit value reductions, and bypassing may again proceed as discussed herein.

As shown in FIGS. 3A-1, 3A-2, a block stripe corresponding row 334-1 can be considered to have a width of 8 (e.g., LUN 231-1 (corresponding to column 332-1); LUN 231-2 (corresponding to column 332-2); LUN 231-3 (corresponding to column 332-3); LUN 231-4 (corresponding to column 332-4); LUN 231-5 (corresponding to column 332-5); LUN 231-6 (corresponding to column 332-6); LUN 231-7 (corresponding to column 332-7); and LUN 231-8 (corresponding to column 332-8). Also, respective block stripes corresponding row 334-2 through row 334-7 can be considered to have respective widths of 8. Block stripes corresponding rows 334-8 and 334-9 can be considered to have a width of 7 (e.g., LUN 231-1 (corresponding to column 332-1); LUN 231-2 (corresponding to column 332-2); LUN 231-4 (corresponding to column 332-4); LUN 231-5 (corresponding to column 332-5), LUN 231-6 (corresponding to column 332-6); LUN 231-7 (corresponding to column 332-7); and LUN 231-8 (corresponding to column 332-8); LUN 231-3 (corresponding to column 332-3) has a reduced credit value equal to 0, as shown in rows 334-8 and 334-9, and is therefore bypassed and not considered part of the block stripes corresponding rows 334-8 and 334-9. A block stripe corresponding row 334-10 can be considered to have a width of 6 (e.g., LUN 231-1 (corresponding to column 332-1); LUN 231-2 (corresponding to column 332-2); LUN 231-4 (corresponding to column 332-4); LUN 231-6 (corresponding to column 332-6); LUN 231-7 (corresponding to column 332-7); and LUN 231-8 (corresponding to column 332-8); LUN 231-3 (corresponding to column 332-3) and LUN 231-5 (corresponding to column 332-5) each have a respective reduced credit value equal to 0, as shown in row 334-10, and are therefore bypassed and not considered part of the block stripe corresponding row 334-10. As such, the LUN widths shown in FIG. 3A have a range from 8 to 6.

Figures 1, 3B:
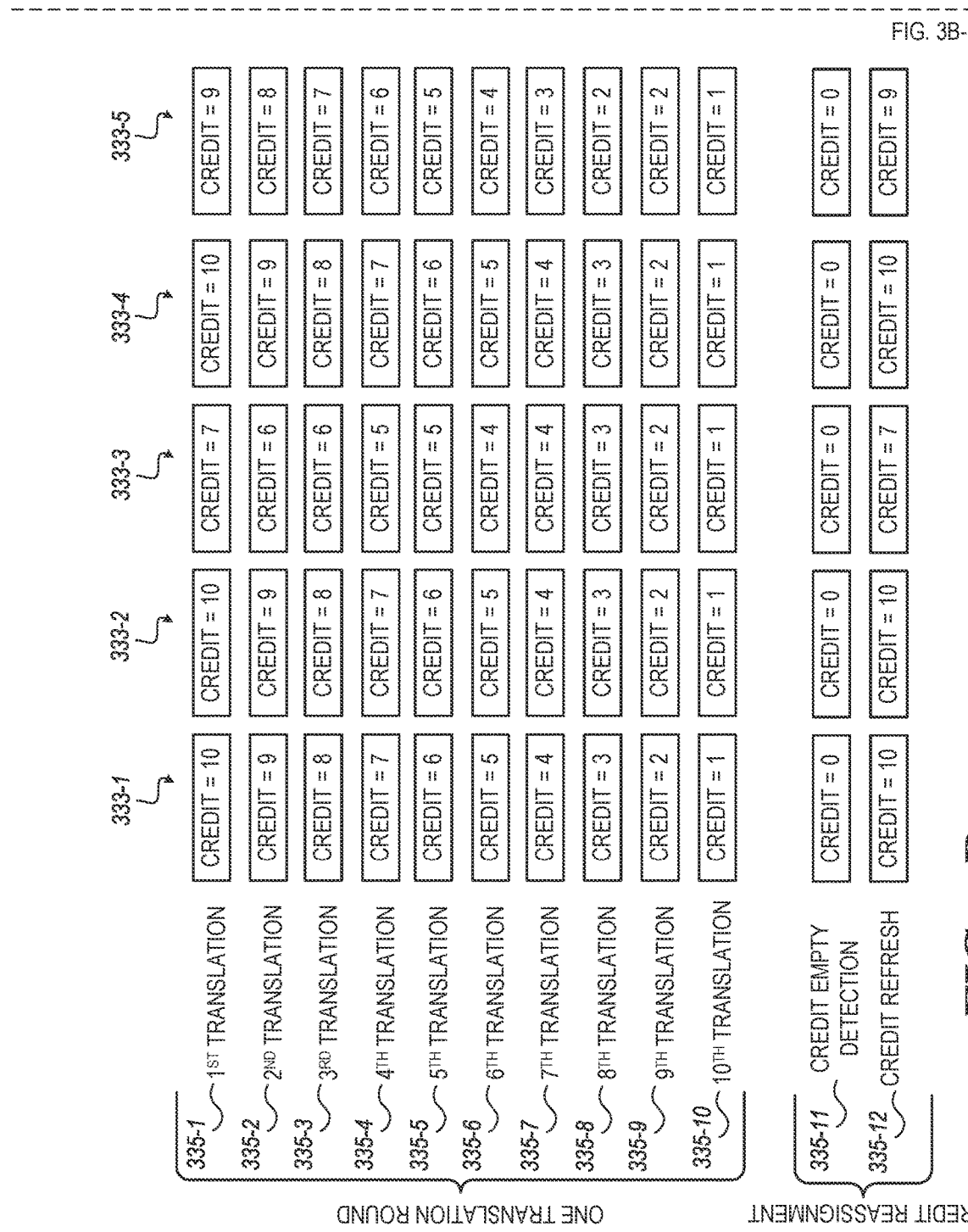

FIGS. 3B-1, 3B-2 is a block diagram of a number of LUNs having a respective initial credit value. As shown in FIGS. 3B-1, 3B-2 and discussed further herein, one or more embodiments provide that an iterational bitmask zero value may be utilized.

As an example, as shown in FIGS. 3B-1, 3B-2, column 333-1 corresponds to LUN 231-1 having an initial credit value of 10; column 333-2 corresponds to LUN 231-2 having an initial credit value of 10; column 333-3 corresponds to LUN 231-3 having an initial credit value of 7; column 333-4 corresponds to LUN 231-4 having an initial credit value of 10; column 333-5 corresponds to LUN 231-5 having an initial credit value of 9; column 333-6 corresponds to LUN 231-6 having an initial credit value of 10; column 333-7 corresponds to LUN 231-7 having an initial credit value of 10; and column 333-8 corresponds to LUN 231-8 having an initial credit value of 10.

One or more embodiments provide that an iterational bitmask zero value may be utilized. The iterational bitmask zero value may be assigned according to an iteration of translation (e.g., comprising a programming operation and an erase operation) to be performed on a number of LUNs of the block stripe. For instance, iterational bitmask zero value may be assigned in an iterational sequence: a second iteration, a fourth iteration, a sixth iteration, an eight iteration, a tenth iteration, a first iteration, a third iteration, a fifth iteration, a seventh iteration, and a ninth iteration. In other words, iterational sequence may be: 2, 4, 6, 8, 10, 1, 3, 5, 7, 9. The iterational sequence may be repeated. For instance, after the iterational bitmask zero value has been applied for each of the iterations 2, 4, 6, 8, 10, 1, 3, 5, 7, and 9, the next iterational bitmask zero value can be applied at the second iteration, etc.

The threshold credit bitmask value may be determined as a number of iterations of translations required such that each LUN of the block stripe has a reduced credit value is equal to 0. The number of iterations of translations required such that each LUN of the block stripe has a reduced credit value is equal to 0 may be referred to as a cycle index. For this example, where LUN 231-1 (corresponding to column 333-1), LUN 231-2 (corresponding to column 333-2), LUN 231-4 (corresponding to column 333-4), LUN 231-6 (corresponding to column 333-6), LUN 231-7 (corresponding to column 333-7), or LUN 231-8 (corresponding to column 333-8), each of have a respective initial credit value of 10, ten iterations are required such that each LUN of the block stripe has a reduced credit value is equal to 0. In other words, the greatest LUN initial credit value (10) is reduced by a unit value (one) ten times (ten iterations of translations) to reach a reduced credit value is equal to 0.

One or more embodiments provide that an iterational bitmask zero value can be applied to one or more LUNs having a respective initial credit value being less than a threshold credit bitmask value. The threshold credit bitmask value can have various values. For instance, the threshold credit bitmask value can have a value of 20, 15, or 10, among other values. Referring again to FIGS. 3B-1, 3B-2, and utilizing a threshold credit bitmask value of 10, provides that iterational bitmask zero values can be assigned to LUN 231-3, corresponding to column 333-3 and having an initial credit value of 7, and LUN 231-5, corresponding to column 333-5 and having an initial credit value of 9. For this example, iterational bitmask zero values would not be assigned to LUN 231-1 (corresponding to column 333-1), LUN 231-2 (corresponding to column 333-2), LUN 231-4 (corresponding to column 333-4), LUN 231-6 (corresponding to column 333-6), LUN 231-7 (corresponding to column 333-7), or LUN 231-8 (corresponding to column 333-8), each of which have a respective initial credit value of 10 (e.g., equal to the threshold credit bitmask value).

One or more embodiments provide that an iterational bitmask zero value can be applied a plurality of times to one or more LUNs having a respective initial credit value being less than a threshold credit bitmask value. For example, iterational bitmask zero value can be applied to a LUN number of times that is equal to the cycle index minus a LUN's respective initial credit value. For this example, as discussed, the cycle index is 10 and LUN 231-3 (corresponding to column 333-3) has an initial credit value of 7. As such an iterational bitmask zero value can be applied to LUN 231-3 (corresponding to column 333-3) 3 times.

One or more embodiments provide that iterational bitmask zero values are assigned to a particular LUN of the block stipe until the applicable iterational bitmask zero values are exhausted, after which is iterational bitmask zero values can be assigned to a different, particular LUN of the block stipe until the applicable iterational bitmask zero values are exhausted, etc. For example, as shown, in FIGS. 3B-1, 3B-2, three iterational bitmask zero values are assigned (respectively at the second iteration, the fourth iteration, and the sixth iteration) to LUN 231-3 (corresponding to column 333-3), after which one iterational bitmask zero value is assigned (at the eighth iteration) to LUN 231-5 (corresponding to column 333-5).

One or more embodiments provide that iterational bitmask zero values are assigned to eligible LUNs of the block stipe in a sequential order. For example, as shown, in FIGS. 3B-1, 3B-2, both LUN 231-3 (corresponding to column 333-3) and LUN 231-5 (corresponding to column 333-5) are eligible to be assigned one or more iterational bitmask zero values. As shown in FIG. 3B-1, 3B-2, all eligible iterational bitmask zero values are assigned to a first coming LUN of the block stripe (e.g., LUN 231-3 (corresponding to column 333-3)), after which all eligible iterational bitmask zero values are assigned to a subsequent LUN of the block stripe (e.g., LUN 231-5 (corresponding to column 333-5)).

As such, for a first translation corresponding to row 335-1, a bitmask {1, 1, 1, 1, 1, 1, 1, 1, 1, 1} may be applied. For this first translation, a respective program operation and erase operation may be performed with each LUN (e.g., corresponding to rows 333-1 through 331-8). Subsequently to the respective erase operations performed with each LUN, each respective credit value can be reduced by one (e.g., as shown in row 335-1 as compared to row 335-2).

As the iterational bitmask zero value, as previously mentioned, is assigned at the second iteration to LUN 231-3 (corresponding to column 333-3), a respective program operation and erase operation will not be performed with LUN 231-3 for the second translation corresponding to row 335-2. Subsequently to the respective erase operations performed with each LUN other than LUN 213-3, each respective credit value can be reduced by one (e.g., as shown in row 335-3 as compared to row 335-2). As shown in rows 335-2, 335-3 the credit value for LUN 213-3 (corresponding to column 333-3) is maintained (e.g., at a value of 6) rather than being reduced. The credit value for LUN 213-3 is maintained because an erase operation was not performed with LUN 231-3 for the second translation due to the iterational bitmask zero value. As such, for a second translation corresponding to row 335-2, a bitmask {1, 1, 0, 1, 1, 1, 1, 1, 1, 1} may be applied.

For a third translation corresponding to row 335-3, a bitmask {1, 1, 1, 1, 1, 1, 1, 1, 1, 1} may be applied. For this third translation, a respective program operation and erase operation may be performed with each LUN (e.g., corresponding to rows 333-1 through 331-8). Subsequently to the respective erase operations performed with each LUN, each respective credit value can be reduced by one (e.g., as shown in row 335-3 as compared to row 335-4).

As the iterational bitmask zero value, as previously mentioned, is assigned at the fourth iteration to LUN 231-3 (corresponding to column 333-3), a respective program operation and erase operation will not be performed with LUN 231-3 for the fourth translation corresponding to row 335-4. Subsequently to the respective erase operations performed with each LUN other than LUN 213-3, each respective credit value can be reduced by one (e.g., as shown in row 335-4 as compared to row 335-5). As shown in rows 335-4, 335-5 the credit value for LUN 213-3 (corresponding to column 333-3) is maintained (e.g., at a value of 5) rather than being reduced. The credit value for LUN 213-3 is maintained because an erase operation was not performed with LUN 231-3 for the fourth translation due to the iterational bitmask zero value. As such, for a fourth translation corresponding to row 335-4, a bitmask {1, 1, 0, 1, 1, 1, 1, 1, 1, 1} may be applied.

For a fifth translation corresponding to row 335-5, a bitmask {1, 1, 1, 1, 1, 1, 1, 1, 1, 1} may be applied. For this fifth translation, a respective program operation and erase operation may be performed with each LUN (e.g., corresponding to rows 333-1 through 331-8). Subsequently to the respective erase operations performed with each LUN, each respective credit value can be reduced by one (e.g., as shown in row 335-5 as compared to row 335-6).

As the iterational bitmask zero value, as previously mentioned, is assigned at the sixth iteration to LUN 231-3 (corresponding to column 333-3), a respective program operation and erase operation will not be performed with LUN 231-3 for the sixth translation corresponding to row 335-6. Subsequently to the respective erase operations performed with each LUN other than LUN 213-3, each respective credit value can be reduced by one (e.g., as shown in row 335-6 as compared to row 335-7). As shown in rows 335-6, 335-7 the credit value for LUN 213-3 (corresponding to column 333-3) is maintained (e.g., at a value of 4) rather than being reduced. The credit value for LUN 213-3 is maintained because an erase operation was not performed with LUN 231-3 for the sixth translation due to the iterational bitmask zero value. As such, for a sixth translation corresponding to row 335-6, a bitmask {1, 1, 0, 1, 1, 1, 1, 1, 1, 1} may be applied.

For a seventh translation corresponding to row 335-7, a bitmask {1, 1, 1, 1, 1, 1, 1, 1, 1, 1} may be applied. For this seventh translation, a respective program operation and erase operation may be performed with each LUN (e.g., corresponding to rows 333-1 through 331-8). Subsequently to the respective erase operations performed with each LUN, each respective credit value can be reduced by one (e.g., as shown in row 335-7 as compared to row 335-8).

As the iterational bitmask zero value, as previously mentioned, is assigned at the eighth iteration to LUN 231-5 (corresponding to column 333-5), a respective program operation and erase operation will not be performed with LUN 231-5 for the eighth translation corresponding to row 335-8. Subsequently to the respective erase operations performed with each LUN other than LUN 213-5, each respective credit value can be reduced by one (e.g., as shown in row 335-8 as compared to row 335-9). As shown in rows 335-8, 335-9 the credit value for LUN 213-5 (corresponding to column 333-5) is maintained (e.g., at a value of 2) rather than being reduced. The credit value for LUN 213-5 is maintained because an erase operation was not performed with LUN 231-5 for the eighth translation due to the iterational bitmask zero value. As such, for a sixth translation corresponding to row 335-8, a bitmask {1, 1, 1, 1, 0, 1, 1, 1, 1, 1} may be applied.

For a ninth translation corresponding to row 335-9, a bitmask {1, 1, 1, 1, 1, 1, 1, 1, 1, 1} may be applied. For this ninth translation, a respective program operation and erase operation may be performed with each LUN (e.g., corresponding to rows 333-1 through 331-8). Subsequently to the respective erase operations performed with each LUN, each respective credit value can be reduced by one (e.g., as shown in row 335-9 as compared to row 335-10).

For a tenth translation corresponding to row 335-10, a bitmask {1, 1, 1, 1, 1, 1, 1, 1, 1, 1} may be applied. For this tenth translation, a respective program operation and erase operation may be performed with each LUN (e.g., corresponding to rows 333-1 through 331-8). Subsequently to the respective erase operations performed with each LUN, each respective credit value can be reduced by one (e.g., as shown in row 335-10 as compared to row 335-11).

As shown in row 335-11, each LUN's respective reduced credit value is (e.g., has been reduced to) equal to 0. When it determined that each LUN's (e.g., each LUN of an associated block stripe) respective reduced credit value is equal to 0, then each of the LUN's respective initial credit values can be reassigned to the respective LUNs. For example, LUN 231-1 having an initial credit value of 10 as shown in row 333-1 can be reduced by a unit value through a number of translations (e.g., erase operations) to the reduced credit value is equal to 0 shown in row 335-11 and thereafter be reassigned the initial credit value of 10 as shown in row 335-12. Similarly, LUN 231-3 having an initial credit value of 7 as shown in row 335-1 can be reduced by a unit value through a number of translations (e.g., erase operations) to the reduced credit value is equal to 0 shown in row 335-11 and thereafter be reassigned the initial credit value of 7 as shown in row 335-12. After each of the LUN's respective initial credit values are reassigned to the respective LUNs, the translations, credit value reductions, bypassing, and/or iterational bitmask zero value assignments may again proceed as discussed herein.

As shown in FIGS. 3B-1, 3B-2, the block stripe widths have a range from 8 (rows 335-1, 335-3, 335-5, 335-7, 335-9, 335-10) to 7 (rows 335-2, 335-4, 335-6, 335-8), which is improved (e.g., narrowed), as compared to the block stripe width range shown in FIGS. 3A-1, 3A-2 (e.g., 8 to 6). A relatively narrower block stripe width range provides an improved functionality, as compared to a relatively broader block strip width range.

Figure 4:
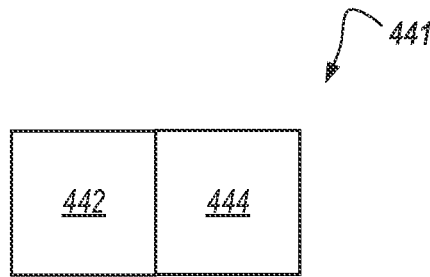
FIG. 4 is a block diagram of a two-bit marker for a LUN of a block stripe in accordance with some embodiments of the present disclosure.

FIG. 4 is a block diagram of a two-bit marker 440 for a LUN of a block stripe in accordance with some embodiments of the present disclosure. The two-bit marker 440 includes a first bit 442 and a second bit 444. Each LUN of a block stripe may be associated with a respective two-bit marker 440. In other words, each LUN of a block stripe may be marked with a respective two-bit marker 440.

One or more embodiments provide that a first bit 442 of the two-bit marker 440 can indicate if a respective LUN of the block stripe is in permanently unusable state or a not-permanently unusable state. For example, a first bit 442 value of "1" can indicate that the LUN being marked the respective two-bit marker 440 is in a permanently unusable state (e.g., that particular LUN is ineligible for current and/or future translations, including program operations), a first bit 442 value of "0" can indicate that the LUN being marked the respective two-bit marker 440 is in a not-permanently unusable state (e.g., that particular LUN is potentially eligible for current and/or future translations, including program operations).

One or more embodiments provide that a second bit 444 of the two-bit marker 440 can indicate if a respective LUN of the block stripe is in a bypass state or a non-bypass state. For example, a second bit 444 value of "1" can indicate that the LUN being marked the respective two-bit marker 440 is in a bypass state (e.g., that particular LUN is ineligible for current and/or future translations, including program operations). The second bit 444 value of "1" may occur when the particular LUN has a reduced credit value of 0 or when the particular LUN has an iterational bitmask zero value, for instance. A second bit 444 value of "0" can indicate that the LUN being marked the respective two-bit marker 440 is in a non-bypass state (e.g., that particular LUN is eligible for current and/or future translations, including program operations). The second bit 444 value of "0" may occur when the particular LUN has a reduced credit value of greater than 0 or when the particular LUN does not have an iterational bitmask zero value, for instance.

Bit combinations for the two-bit marker 440 include the first bit 442 being "1" and the second bit 444 being "1". This bit combination for the two-bit marker 440 can indicate that the particular LUN being marked with the respective two-bit marker 440 is in a permanently unusable state. One or more embodiments provide that a particular LUN being marked with the first bit 442 being "1" and the second bit 444 being "1" indicates that the particular LUN is permanently unusable (e.g., that particular LUN is ineligible for current and/or future translations, including program operations).

Bit combinations for the two-bit marker 440 include the first bit 442 being "1" and the second bit 444 being "0". One or more embodiments provide that this bit combination for the two-bit marker 440 is an ineligible bit combination. Ineligible bit combinations are not utilized to mark particular LUNs. As such, this bit combination is not utilized.

Bit combinations for the two-bit marker 440 include the first bit 442 being "0" and the second bit 444 being "1". This bit combination for the two-bit marker 440 can indicate that the particular LUN being marked with the respective two-bit marker 440 is in a not-permanently unusable state. One or more embodiments provide that a particular LUN being marked with the first bit 442 being "0" and the second bit 444 being "1" indicates that the particular LUN is in a not-permanently unusable state (e.g., a temporarily unusable state). The temporarily unusable state can indicate that particular LUN is ineligible for a current translation, including a program operation).

Bit combinations for the two-bit marker 440 include the first bit 442 being "0" and the second bit 444 being "0". This bit combination for the two-bit marker 440 can indicate that the particular LUN being marked with the respective two-bit marker 440 is in a usable state. One or more embodiments provide that a particular LUN being marked with the first bit 442 being "0" and the second bit 444 being "0" indicates that the particular LUN is eligible for a current translation, including a program operation). One or more embodiments provide that the first bit 442 being "0" and the second bit 444 being "0" is a respective default bit combination for each LUN of a block stripe.

One or more embodiments provide that the bit combination of the first bit 442 being "0" and the second bit 444 being "0" can be changed to the bit combination of the first bit 442 being "0" and the second bit 444 being "1". This can indicate that a particular LUN being marked with the first bit 442 being "0" and the second bit 444 being "0" was eligible for a current translation; however, when that particular LUN is now marked with the first bit 442 being "0" and the second bit 444 being "1" that particular LUN is now in a not-permanently unusable state (e.g., a temporarily unusable state).

One or more embodiments provide that the bit combination of the first bit 442 being "0" and the second bit 444 being "1" can be changed to the bit combination of the first bit 442 being "1" and the second bit 444 being "1". This can indicate that a particular LUN being marked with the first bit 442 being "0" and the second bit 444 being "1" was in a not-permanently unusable state (e.g., a temporarily unusable state); however, when that particular LUN is now marked with the first bit 442 being "1" and the second bit 444 being "1" that particular LUN is now in a permanently unusable state.

One or more embodiments provide that the bit combination of the first bit 442 being "0" and the second bit 444 being "0" can be changed to the bit combination of the first bit 442 being "1" and the second bit 444 being "1". This can indicate that a particular LUN being marked with the first bit 442 being "0" and the second bit 444 being "0" was eligible for a current translation; however, when that particular LUN is now marked with the first bit 442 being "1" and the second bit 444 being "1" that particular LUN is now in a permanently unusable state.

One or more embodiments provide that the bit combination of the first bit 442 being "0" and the second bit 444 being "1" can be changed to the bit combination of the first bit 442 being "0" and the second bit 444 being "0". This can indicate that a particular LUN being marked with the first bit 442 being "0" and the second bit 444 being "1" was in a not-permanently unusable state (e.g., a temporarily unusable state); however, when that particular LUN is now marked with the first bit 442 being "0" and the second bit 444 being "0" that particular LUN is now eligible for a current translation.

One or more embodiments provide that the bit combination of the first bit 442 being "1" and the second bit 444 being "1" cannot be changed to the bit combination of the first bit 442 being "1" and the second bit 444 being "0". In other words, the bit combination of the first bit 442 being "1" and the second bit 444 being "0" is ineligible from the bit combination of the first bit 442 being "1" and the second bit 444 being "1".

One or more embodiments provide that the bit combination of the first bit 442 being "1" and the second bit 444 being "1" cannot be changed to the bit combination of the first bit 442 being "0" and the second bit 444 being "0". In other words, the bit combination of the first bit 442 being "0" and the second bit 444 being "0" is ineligible from the bit combination of the first bit 442 being "1" and the second bit 444 being "1".

Figure 5:
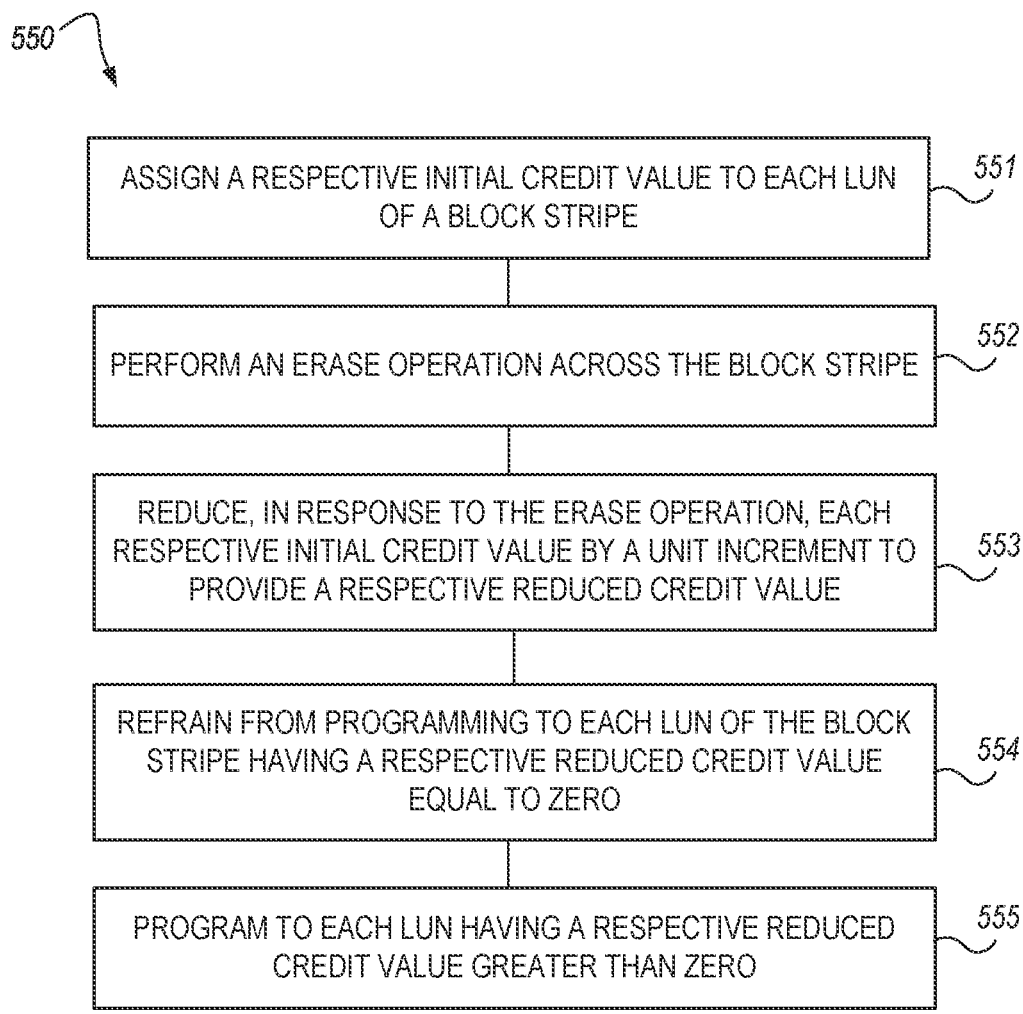
FIG. 5 is flow diagram corresponding to a method for bypassing a LUN of a block stripe in accordance with some embodiments of the present disclosure.

FIG. 5 is flow diagram corresponding to a method 550 for bypassing a LUN of a block stripe in accordance with some embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the bypass component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 551, the method 550 can include assigning a respective initial credit value to each LUN of a block stripe, as discussed with FIG. 3A, for instance.

At block 552, the method 550 can include performing an erase operation across the block stripe. As discussed, iterations of translations can include operations, such as program operations and erase operations.

At block 553, the method 550 can include reducing, in response to the erase operation, each respective initial credit value by a unit increment to provide a respective reduced credit value.

At block 554, the method 550 can include refraining from programming to each LUN of the block stripe having a respective reduced credit value equal to zero. As discussed, a bit combination for the two-bit marker 440 with the first bit 442 being "0" and the second bit 444 being "1" can indicate that the particular LUN being marked with the respective two-bit marker 440 is in a not-permanently unusable state. That particular LUN being marked with the first bit 442 being "0" and the second bit 444 being "1" indicates that the particular LUN is in a not-permanently unusable state (e.g., a temporarily unusable state). The temporarily unusable state can indicate that particular LUN is ineligible (e.g., programming is refrained from) for a current translation, including a program operation.

At block 555, the method 550 can include programming to each LUN having a respective reduced credit value greater than zero. As discussed, a bit combination for the two-bit marker 440 with the first bit 442 being "0" and the second bit 444 being "0" can indicate that the particular LUN being marked with the respective two-bit marker 440 is in a usable state. That a particular LUN being marked with the first bit 442 being "0" and the second bit 444 being "0" indicates that the particular LUN is eligible for a current translation, including a program operation).

In some embodiments, the method 550 can include determining that each respective reduced credit value is equal to zero. For instance, a number of iterations of translations can be performed, where a number of unit increment reductions provide that each LUN of the block stripe has a reduced credit value is equal to 0.

In some embodiments, the method 550 can include reassigning the respective initial credit value to each LUN having a respective reduced credit value equal to zero.

Figure 6:
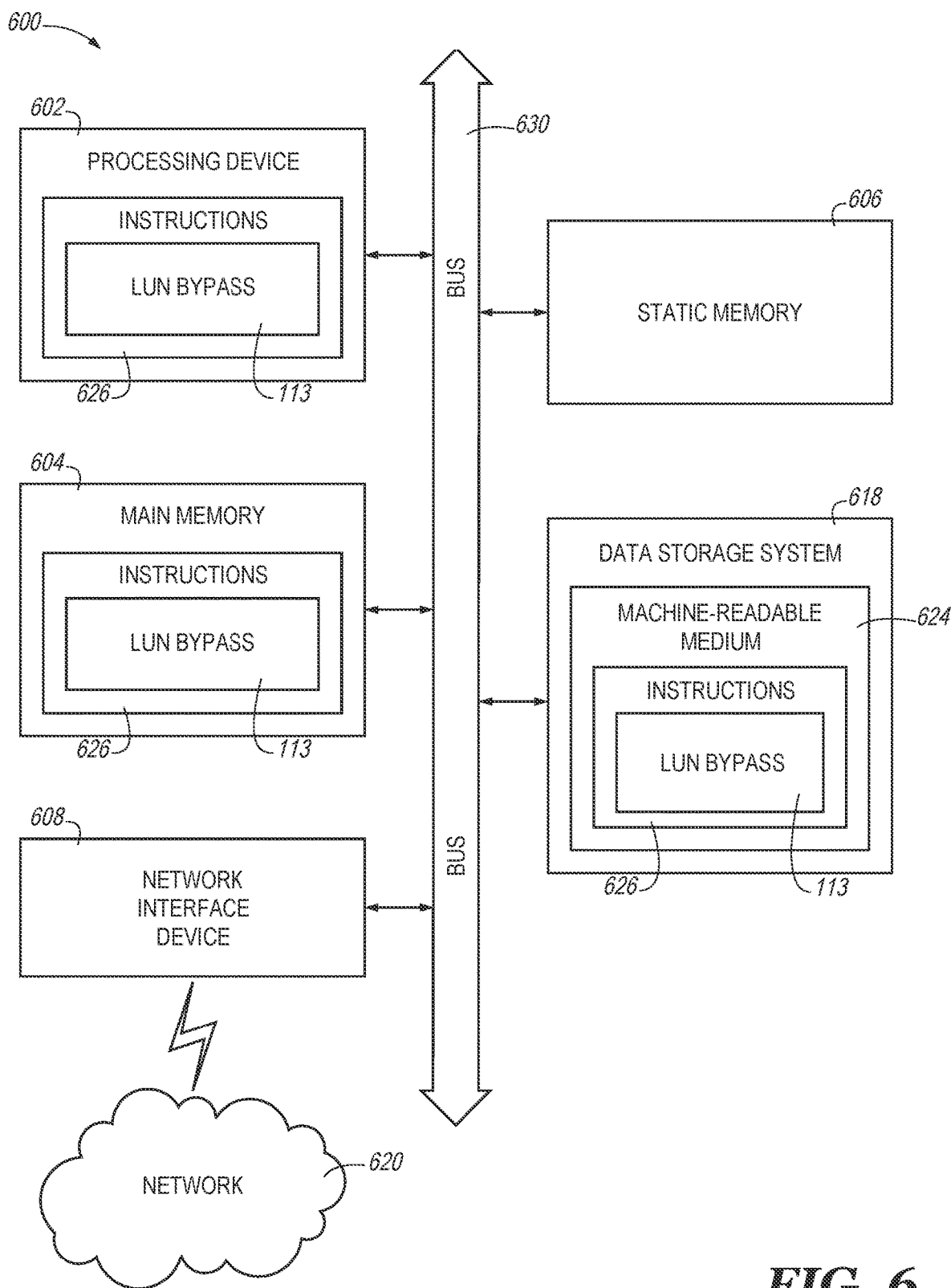
FIG. 6 is a block diagram of an example computer system in which embodiments of the present disclosure may operate.

FIG. 6 is a block diagram of an example computer system 600 in which embodiments of the present disclosure may operate. FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the LUN bypass component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a LUN bypass component (e.g., the LUN bypass component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   assigning a respective initial credit value to each LUN of a block stripe;
   performing an erase operation across the block stripe;
   reducing, in response to the erase operation, each respective initial credit value by a unit increment to provide a respective reduced credit value;
   refraining from programming to each LUN of the block stripe having a respective reduced credit value equal to zero;
   programming to each LUN of the block stripe having a respective reduced credit value greater than zero;
   determining that each respective reduced credit value is equal to zero; and
   reassigning the respective initial credit value to each LUN of the block stripe where each respective reduced credit value is equal to zero.

2. The method of claim 1, wherein the respective initial credit values have a plurality of values.

3. The method of claim 2, wherein the plurality of values is in a range from 10 to 1.

4. The method of claim 1, further comprising marking each LUN of the block stripe with a respective two-bit marker.

5. The method of claim 4, wherein a first bit of the two-bit marker indicates if a respective LUN of the block stripe is in permanently unusable state or a not-permanently unusable state.

6. The method of claim 5, wherein a second bit of the two-bit marker indicates if a respective LUN of the block stripe is in a bypass state or a non-bypass state.

7. An apparatus comprising:
memory system controller including a processor, and a bypass component including logic circuitry configured to perform bypass operations, the bypass component configured to:
assign a respective initial credit value to each LUN of a block stripe;
assign a respective iterational bitmask zero value to each LUN of the block stripe with the respective initial credit value being less than a threshold credit bitmask value;
perform an erase operation across the block stripe;
reduce, in response to the erase operation, each respective initial credit value by a unit increment to provide a respective reduced credit value, wherein each LUN of the block stripe having respective iterational bitmask zero value does not have the respective initial credit value reduced;
refrain from programming to each LUN of the block stripe having a respective iterational bitmask zero value;
refrain from programming to each LUN of the block stripe having a respective reduced credit value equal to zero; and
program to each LUN of the block stripe having a respective reduced credit value greater than zero and to each LUN having a respective iterational bitmask non-zero value.

8. The apparatus of claim 7, wherein the threshold credit bitmask value is ten.

9. The apparatus of claim 7, wherein the respective iterational bitmask zero values are applied in an iterational sequence.

10. The apparatus of claim 9, wherein the iterational sequence sequentially includes a second iteration, a fourth iteration, a sixth iteration, an eighth iteration, a tenth iteration, a first iteration, a third iteration, a fifth iteration, a seventh iteration, and a ninth iteration.

11. The apparatus of claim 10, wherein the iterational sequence is sequentially repeated following the ninth iteration.

12. The apparatus of claim 7, wherein the respective iterational bitmask zero value provides that a respective two-bit marker for each LUN of the block stripe having the respective iterational bitmask zero value indicates that each LUN of the block stripe having the respective iterational bitmask zero value is in a bypass state.

13. The apparatus of claim 12, wherein the respective iterational bitmask non-zero value provides that the respective two-bit marker for each LUN of the block stripe having the respective iterational bitmask non-zero value indicates that each LUN of the block stripe having the respective iterational bitmask non-zero value is in a non-bypass state.

14. A system, comprising:
a plurality of memory components arranged to form a stackable cross-gridded array of memory cells that form a memory device; and
a memory system controller including a processing device and a bypass component coupled to the memory device, wherein the processing device and bypass component are is configured to:
assign a respective initial credit value to each LUN of a block stripe, wherein the respective initial credit values include a plurality of different values;
perform an erase operation across the block stripe;
reduce, in response to the erase operation, each respective initial credit value by a unit increment to provide a respective reduced credit value;
refrain from programming to each LUN of the block stripe having a respective reduced credit value equal to zero;
program to each LUN of the block stripe having a respective reduced credit value greater than zero, and
refrain from programming to each LUN of the block stripe having a respective iterational bitmask zero value, which indicates that each LUN of the block stripe having the respective iterational bitmask zero value is in a bypass state.

15. The system of claim 14, wherein the respective initial credit value of each LUN of the block stripe corresponds to a respective program erase count endurance of each LUN of the block stripe.

16. The system of claim 14, wherein one or more of the LUNs of the block stripe have a program erase count endurance of 10,000 or greater.

17. The system of claim 14, wherein one or more of the LUNs of the block stripe have a program erase count endurance of less than 10,000.

* * * * *